(12) United States Patent
Hutchinson (10) Patent No.: US 9,425,599 B2
(45) Date of Patent: Aug. 23, 2016

(54) DEVICES, SYSTEMS, AND METHODS TO SECURE WIRES AND PREVENT WIRE THEFT

(71) Applicant: Hutchinson Wire Solutions, LLC, Shelbyville, IN (US)

(72) Inventor: Brock E. Hutchinson, Shelbyville, IN (US)

(73) Assignee: Hutchinson Wire Solutions, LLC, Shelbyville, IN (US)

(*) Notice: Subject to any disclaimer, the term of this patent is extended or adjusted under 35 U.S.C. 154(b) by 0 days.

(21) Appl. No.: 14/602,787

(22) Filed: Jan. 22, 2015

(65) Prior Publication Data

US 2015/0204462 A1   Jul. 23, 2015

Related U.S. Application Data

(60) Provisional application No. 61/930,216, filed on Jan. 22, 2014.

(51) Int. Cl.
| | |
|---|---|
| *F16L 3/08* | (2006.01) |
| *H02G 3/32* | (2006.01) |
| *F16L 3/137* | (2006.01) |
| *H01L 23/00* | (2006.01) |
| *F16L 3/01* | (2006.01) |
| *F16L 3/12* | (2006.01) |

(52) U.S. Cl.
CPC ........ *H02G 3/32* (2013.01); *F16L 3/137* (2013.01); *H01L 24/00* (2013.01); *F16L 3/01* (2013.01); *F16L 3/12* (2013.01); *Y10T 29/49948* (2015.01)

(58) Field of Classification Search
CPC ............... F16L 3/137; F16L 3/01; F16L 3/12; H02G 3/32

USPC ............ 248/74.3, 74.1, 68.1, 67.5, 74.5, 551, 248/548, 909
See application file for complete search history.

(56) References Cited

U.S. PATENT DOCUMENTS

| | | | | |
|---|---|---|---|---|
| 3,458,163 | A * | 7/1969 | Egerton-Smith | ........ H02G 3/32 174/155 |
| 5,443,232 | A * | 8/1995 | Kesinger | ................ H02G 3/263 248/62 |
| 5,742,982 | A * | 4/1998 | Dodd | ..................... F16G 11/00 24/16 R |
| 6,071,148 | A * | 6/2000 | Radliff | ............... H01R 13/5221 439/587 |
| 6,349,912 | B1 * | 2/2002 | Schauss | .................... E04B 1/58 248/228.1 |
| 6,578,800 | B2 * | 6/2003 | Stefan | .................. B25J 19/0025 248/52 |
| 7,150,439 | B2 * | 12/2006 | Konold | .................. H02G 3/266 248/205.3 |
| 9,106,068 | B2 * | 8/2015 | Barna | ..................... H02G 3/32 |
| 2015/0152980 | A1 * | 6/2015 | Okura | ................ B60R 16/0215 248/74.2 |
| 2015/0233520 | A1 * | 8/2015 | Fisher | ..................... H05B 3/06 219/201 |

* cited by examiner

*Primary Examiner* — Anita M King
(74) *Attorney, Agent, or Firm* — Reichel Stohry LLP; Mark C. Reichel; Natalie J. Dean (57) ABSTRACT

Devices, systems, and methods to secure wires and prevent wire theft. In an exemplary embodiment of a system of the present disclosure, the system comprises a wire grip portion comprising a compressible material and having a first aperture and a first groove defined therein, the first groove extending from an outer boundary of the wire grip portion to the first aperture, a collar configured to surround the outer boundary of the wire grip portion, and a first locking mechanism coupled to or formed as part of the collar, the first locking mechanism configured so to tighten the collar relative to the wire grip portion.

19 Claims, 11 Drawing Sheets

DEVICES, SYSTEMS, AND METHODS TO SECURE WIRES AND PREVENT WIRE THEFT

PRIORITY

The present application is related to, and claims the priority benefit of, U.S. Provisional Patent Application Ser. No. 61/930,216 filed Jan. 22, 2014, the contents of which are incorporated into the present disclosure in their entirety.

BACKGROUND

Wire theft, such as in connection with lampposts and other outdoor equipment having or using wires therein, is unfortunately a rampant problem, especially for governmental entities and other businesses that maintain them. In view of the same, devices, systems, and methods to secure wires and prevent wire theft would be well received in the marketplace.

BRIEF SUMMARY

In an exemplary embodiment of a system for securing wire and/or preventing wire theft of the present disclosure, the system comprises one or more of the following elements/components coupled to and/or used in connection with one another, as described herein: a) one or more wire grip portions 100, defining one or more apertures (such as apertures 102) and one or more grooves (such as grooves 104) therein; and/or b) one or more collars (such as collars 150); and/or c) one or more locking mechanisms (such as locking mechanisms 450), comprising or used in connection with one or more threaded rods (such as threaded rods 460), one or more flanges (such as flanges 470), and one or more locking nuts (such as locking nuts 410) having one or more indentations (such as indentations 412).

In various system embodiments, the system is used to secure one or more wires (such as wires 400) therein. In various embodiments, a tool (such as tool 420) having an end (such as end 422) can be used to tighten and/or loosen the one or more locking nuts.

In an exemplary embodiment of a system for securing wire and/or preventing wire theft of the present disclosure, the system further comprises a second locking mechanism (such as second locking mechanism 480) and/or a wire cylinder (such as wire cylinder 490).

In an exemplary embodiment of a method of securing wire and/or preventing wire theft of the present disclosure, the method comprises the step of using one or more systems of the present disclosure, as described herein, to secure wire.

In an exemplary embodiment of a system of the present disclosure, the system comprises a wire grip portion comprising a compressible material and having a first aperture and a first groove defined therein, the first groove extending from an outer boundary of the wire grip portion to the first aperture, a collar configured to surround the outer boundary of the wire grip portion, and a first locking mechanism coupled to or formed as part of the collar, the first locking mechanism configured so to tighten the collar relative to the wire grip portion. In another embodiment, and when a first wire is positioned within the first aperture and the first locking mechanism is tightened, the first wire is secured within the wire grip portion. In yet another embodiment, the wire grip portion is generally cylindrical as defined by the outer boundary and a height of the wire grip portion. In an additional embodiment, the first groove has a depth equal to the height of the wire grip portion.

In an exemplary embodiment of a system of the present disclosure, the wire grip portion also has a second aperture defined therein, and wherein the first groove extends from the outer boundary of the wire grip portion to the first aperture and to the second aperture. In an additional embodiment, the wire grip portion also has a third aperture defined therein, and wherein the first groove extends from the outer boundary of the wire grip portion to the first aperture to the second aperture and to the third aperture. In yet an additional embodiment, the wire grip portion also has a third aperture and a fourth aperture defined therein, and wherein a second groove extends from the outer boundary of the wire grip portion to the third aperture and to the fourth aperture.

In an exemplary embodiment of a system of the present disclosure, the first locking mechanism comprises a threaded rod and a locking nut, wherein part of the first locking mechanism is present within a flange coupled to the collar. In another embodiment, rotation of the locking nut in a first direction causes the first locking mechanism to tighten the collar relative to the wire grip portion, and wherein rotation of the locking nut in a second direction causes the first locking mechanism to loosen the collar relative to the wire grip portion. In yet another embodiment, the system further comprises a second locking mechanism configured to engage the threaded rod upon rotation in a first direction. In an additional embodiment, the first locking mechanism comprises a first fastener configured to engage a first collar flange and a second collar flange extending from a perimeter portion of the collar.

In an exemplary embodiment of a system of the present disclosure, rotation of the first fastener in a first direction causes the first locking mechanism to tighten the collar relative to the wire grip portion, and wherein rotation of the first fastener in a second direction causes the first locking mechanism to loosen the collar relative to the wire grip portion. In an additional embodiment, the system further comprises a wire cylinder coupled to or positioned adjacent to wire grip portion, the wire cylinder configured to receive one or more wires therethrough.

In an exemplary embodiment of a system of the present disclosure, the system comprises a wire grip portion comprising a compressible material and having a first aperture, a second aperture, and a first groove defined therein, the first groove extending from an outer boundary of the wire grip portion to the first aperture and to the second aperture, a collar configured to surround the outer boundary of the wire grip portion, and a first locking mechanism coupled to or formed as part of the collar, the first locking mechanism configured so to tighten the collar relative to the wire grip portion, wherein when a first wire is positioned within the first aperture and the first locking mechanism is tightened, the first wire is secured within the wire grip portion. In another embodiment, the wire grip portion also has a third aperture defined therein, and wherein the first groove extends from the outer boundary of the wire grip portion to the first aperture to the second aperture and to the third aperture. In yet another embodiment, the wire grip portion also has a third aperture and a fourth aperture defined therein, and wherein a second groove extends from the outer boundary of the wire grip portion to the third aperture and to the fourth aperture.

In an exemplary embodiment of a system of the present disclosure, the first locking mechanism comprises a threaded rod and a locking nut, wherein part of the first locking mechanism is present within a flange coupled to the collar, wherein rotation of the locking nut in a first direction causes the first locking mechanism to tighten the collar relative to the wire grip portion, and wherein rotation of the locking nut in a second direction causes the first locking mechanism to loosen the collar relative to the wire grip portion. In another embodiment, the first locking mechanism comprises a first fastener configured to engage a first collar flange and a second collar flange extending from a perimeter portion of the collar, wherein rotation of the first fastener in a first direction causes the first locking mechanism to tighten the collar relative to the wire grip portion, and wherein rotation of the first fastener in a second direction causes the first locking mechanism to loosen the collar relative to the wire grip portion.

In an exemplary embodiment of a method of the present disclosure, the method comprises the steps of positioning a first wire into a first aperture of a system, the system comprising a wire grip portion comprising a compressible material and having the first aperture and a first groove defined therein, the first groove extending from an outer boundary of the wire grip portion to the first aperture, a collar configured to surround the outer boundary of the wire grip portion, and a first locking mechanism coupled to or formed as part of the collar, the first locking mechanism configured so to tighten the collar relative to the wire grip portion, and tightening the first locking mechanism to secure the first wire within the wire grip portion. In another embodiment, the step of tightening is performed by tightening a first portion of a fastener of the first locking mechanism so to break the first portion of the fastener off from a second portion of the fastener which remains as part of the first locking mechanism.

BRIEF DESCRIPTION OF THE DRAWINGS

The disclosed embodiments and other features, advantages, and disclosures contained herein, and the matter of attaining them, will become apparent and the present disclosure will be better understood by reference to the following description of various exemplary embodiments of the present disclosure taken in conjunction with the accompanying drawings, wherein.

An overview of the features, functions and/or configurations of the components depicted in the various figures will now be presented. It should be appreciated that not all of the features of the components of the figures are necessarily described. Some of these non-discussed features, such as various couplers, etc., as well as discussed features are inherent from the figures themselves. Other non-discussed features may be inherent in component geometry and/or configuration.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

Figure 1:
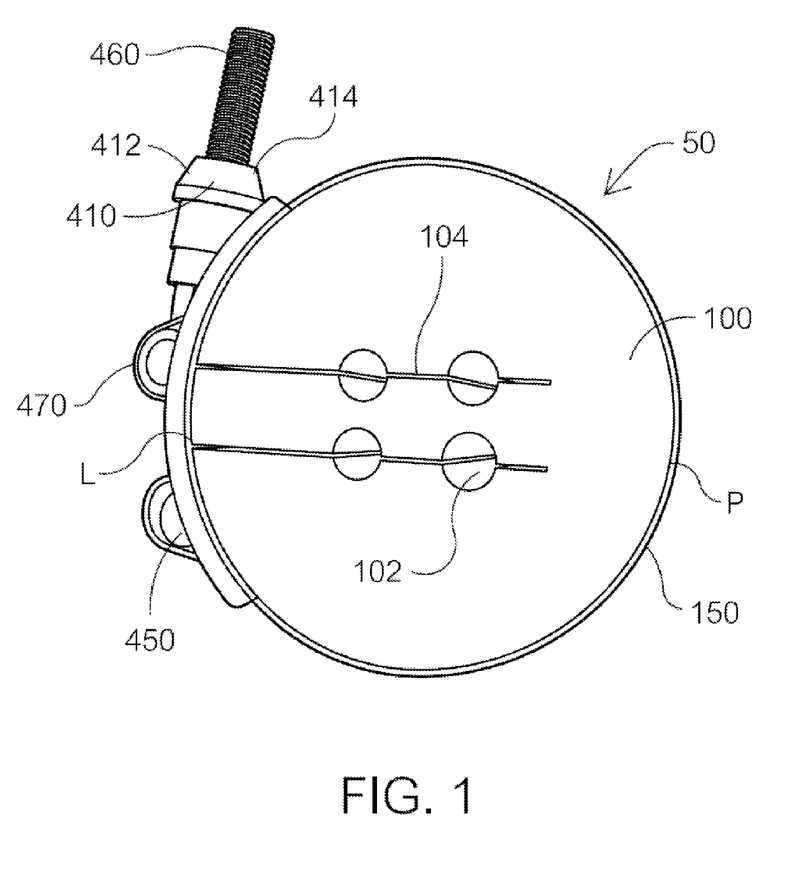
FIG. 1 shows a system with a wire grip portion in a relatively closed configuration, according to an exemplary embodiment of the present disclosure.

An exemplary system for securing wires of the present disclosure is shown in FIG. 1. As shown in FIG. 1, system 50 comprises a wire grip portion 100 configured to be positioned within a tightened collar 150. Wire grip portion 100, in various embodiments, comprises a spongy/compliant material such as rubber (including vulcanized rubber), foam, foam rubber, and the like, so that when a collar 150 is positioned around a perimeter/boundary of wire grip portion 100, wire grip portion 100 can compress somewhat to secure one or more wires positioned therein, as discussed in further detail herein.

Figure 2:
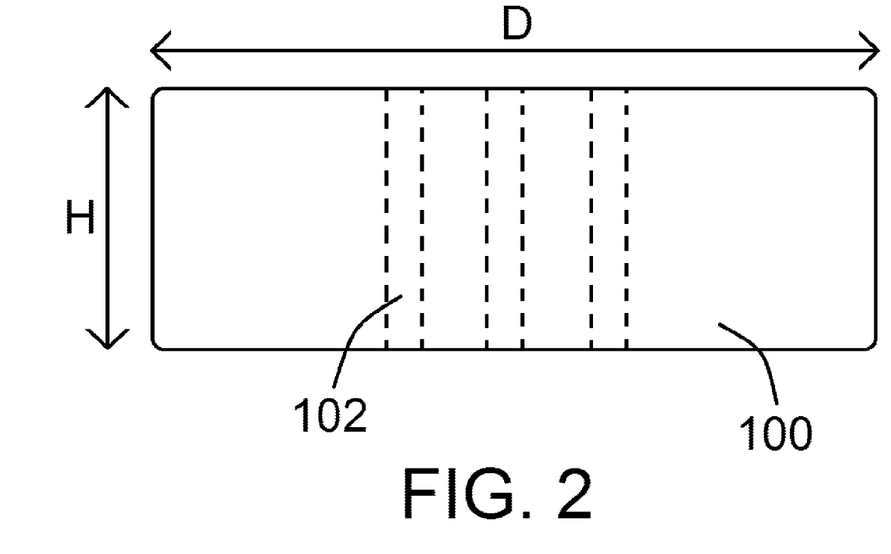
FIG. 2 shows a side view of a wire grip portion, according to an exemplary embodiment of the present disclosure.

As shown in FIG. 1, an exemplary wire grip portion 100 can have a generally cylindrical shape, namely as having a round perimeter (a circumference if round, and generally referred to as an outer boundary) with some height/depth. In an exemplary embodiment, and as shown in the side view of an exemplary wire grip portion 100 of the present disclosure as shown in FIG. 2, wire grip portion 100 has a diameter ("D") of or about 3" and a height ("H") of or about 1". In other embodiments, wire grip portion 100 may have a larger or smaller diameter D and/or a larger or smaller height/depth H.

Figure 3:
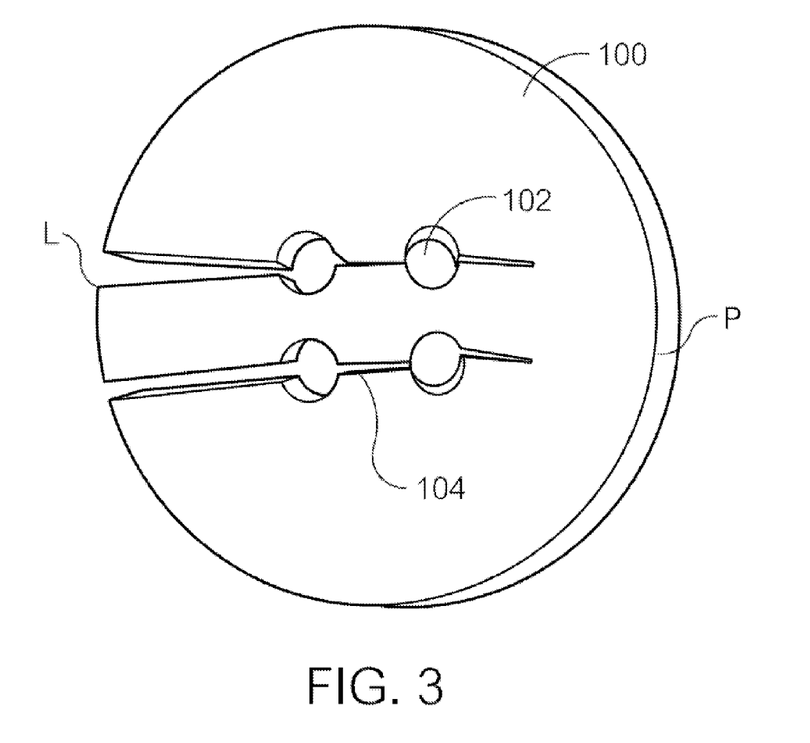
FIG. 3 shows a wire grip portion in a relatively opened configuration, according to an exemplary embodiment of the present disclosure.
Figure 4:
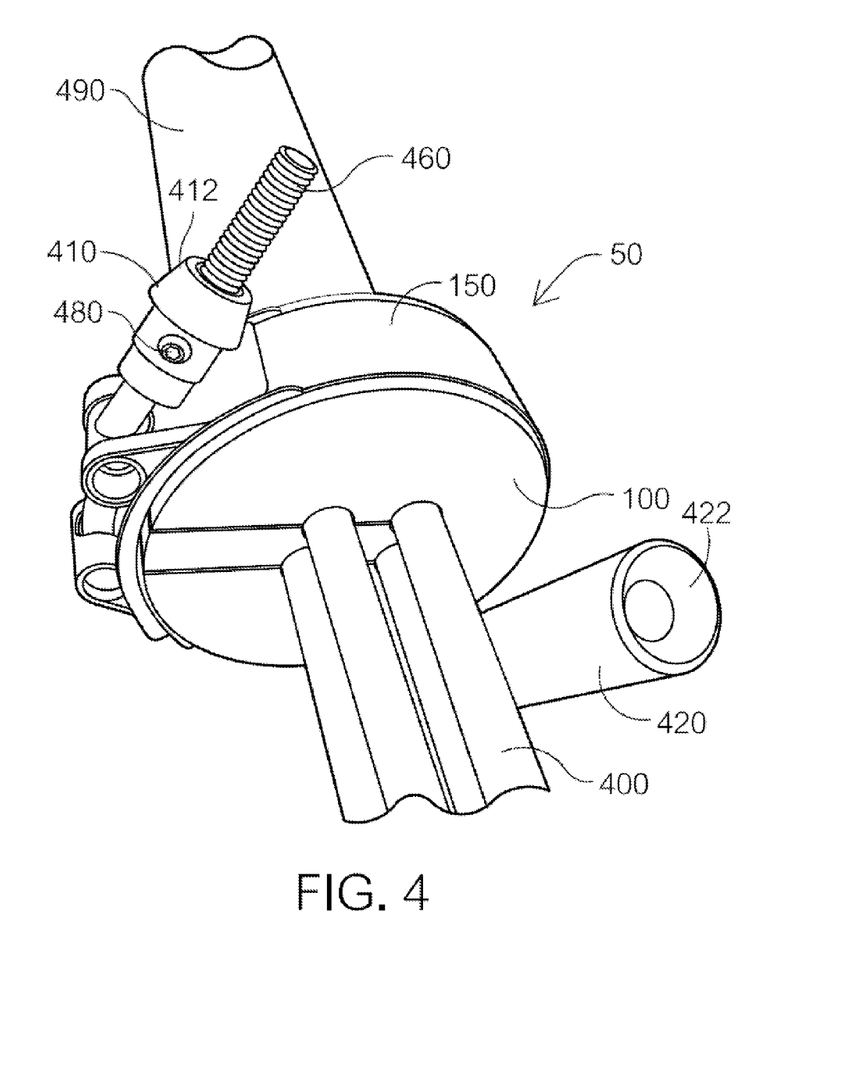
FIG. 4 shows a perspective view of system having a plurality of wires secured therein, according to an exemplary embodiment of the present disclosure.

Wire grip portions 100, as referenced herein, comprise at least one, and in various embodiments, two, three, four (as shown in FIGS. 1, 3, and 4), or more apertures 102 defined therein, said apertures 102 extending an entire height H of wire grip portion 100. At least one groove 104, and in several embodiments two or more grooves 104, as shown in FIGS. 1 and 3, extend from a location ("L"), as shown in FIGS. 1 and 3, of an outer boundary/perimeter ("P") of wire grip portion 100 to, and in various embodiments, through said apertures 102. In at least one embodiment, each aperture 102 has a separate groove 104 extending thereto or therethrough. In other embodiments, such as shown in FIG. 1, one groove 104 can extend to and through two (as shown) or more apertures 102, such as extending through three apertures 102. Grooves 104, similar to apertures 102, extend an entire height H of wire grip portion 100.

Apertures 102, as referenced and shown herein, are sized and shaped to correspond to, or be slightly smaller than, the size and shape of a cross-section of a coated or uncoated wire 400, as shown in FIG. 4. One or more wires 400, corresponding to one or more apertures 102, can be positioned within wire grip portion 100 by either extending wire(s) 400 through apertures 102 from one side of wire grip portion 100 to another (namely, as shown in FIG. 2, through wire grip portion 100 in a direction of the arrows shown corresponding to height H), and/or through the one or more grooves 104, as shown in FIGS. 1 and 3. Wire grip portion 100 can be relatively opened by pulling portions of wire grip portion 100 so that one or more grooves 104 open to provide access to the one or more apertures 102. After wire(s) 400 is/are positioned within wire grip portion 100 within apertures 102, wire grip portion 100 can be relatively closed by compressing portions of perimeter P of wire grip portion 100, either by hand, by using collar 150, or by using another device/mechanism.

After all desired wires 400 are positioned within apertures 102 of wire grip portion, collar 150 can be tightened around or about wire grip portion 100 (due to the general compressibility of some or all of wire grip portion 100), and ultimately locked in place (as described in further detail herein), to secure wires 400 therein and prevent or reduce instances of wire theft.

As referenced above and shown in FIGS. 1 and 4, collar 150 is sized and shaped to fit around the perimeter P of wire grip portion 100 and further configured to be tightened around the same. Collar 150, and additional components of or coupled to collar 150, can comprise one or more of several materials, such as plastic and/or metal, including, but not limited to, stainless steel or zinc. An exemplary collar 150 embodiment, as shown in FIGS. 1 and 4, comprises stainless steel, while locking nut 410 comprises zinc. In other embodiments, collar 150, locking nut 410, and/or other components comprise the same or different metal or plastic components.

Tightening collar 150, such as by rotating locking nut 410 in a first direction, causes pressure to be applied inward, such as from perimeter P of wire grip portion 100 inward, causing wires 400 positioned within wire grip portion 100 to be tightly gripped by wire grip portion 100 within apertures 102. In various embodiments, collar 150 comprises a locking mechanism 450 coupled thereto, formed as part of collar 150, or otherwise used in connection by collar 150, whereby locking mechanism 450 is configured to tighten and loosen collar 150 around/about wire grip portion 100 as desired. In at least one embodiment, locking mechanism 450 comprises a threaded rod 460 coupled to, or otherwise engaged by, a portion of collar 150, whereby locking nut 410 can be rotated in a first direction around/about threaded rod 460 to tighten collar 150. Such a rotation can facilitate collar 150 tightening by way of locking nut 410, or a component coupled to or in communication with locking nut 410, engaging and applying pressure or a force to a flange 470 coupled to collar 150 and/or as part of (coupled to or in communication with) locking mechanism 450. For example, and in at least one embodiment, flange 470 is coupled to locking mechanism 450, and tightening locking nut 410 about threaded rod 460 causes collar 150 to tighten around/about wire grip portion 100. In another embodiment, flange 470 is a portion of collar 150, whereby threaded rod 460 is partially positioned within, coupled to, or engaged by, flange 470, so that tightening locking nut 410 causes collar 150 to tighten. As referenced herein, and in general as pertaining to at least one embodiment, rotation of locking nut 410 in a first direction causes collar 150 to tighten (causing a diameter defined by collar 150, corresponding to a general perimeter P of wire grip portion 100, to become smaller), and rotation of locking nut 410 in a second direction causes collar 150 to loosen (causing a diameter defined by collar 150, corresponding to a general perimeter P of wire grip portion 100, to become larger).

Figure 5:
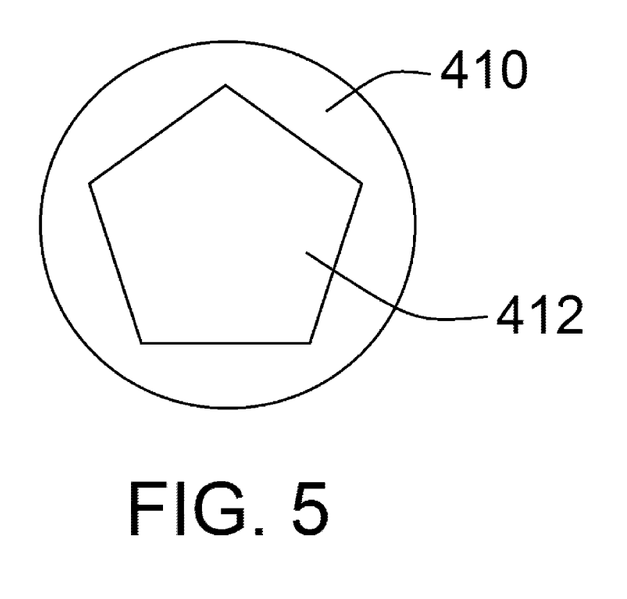
FIG. 5 shows a front view of a locking nut, according to an exemplary embodiment of the present disclosure.

In various embodiments, locking nut 410 has at least one indentation 412 defined therein, with said indentation 412 corresponding to a tool useful to engage indentation 412 to rotate locking nut 410, especially when locking nut 410 is already generally tightened about threaded rod 460. In at least one embodiment, indentation(s) 412 is/are defined within a tapered portion 414 of locking nut 410, as shown in FIG. 1. One or more indentations 412 may be present, and may comprise any number of shapes/configurations, such as straight indentations 412 or indentations 412 having one of several shapes. In various embodiments, indentations 412, considered alone or along with a general shape of locking nut 410, may result in a "non-traditional" configuration, namely one that a traditional tool would not be able to open. Exemplary non-traditional configurations may include, but are not limited to, a) the combination of a locking nut 410 having a tapered portion 414 and one or more indentations 412 defined therein, said indentations 412 being relatively straight (as shown in FIG. 1, for example), b) a locking nut 410 having a pentagonal (five-sided) indentation 412 defined therein, (as shown in FIG. 5, for example), and c) a locking nut 410 having one or more other indentations 412 defined therein. A tool 420, as shown in FIG. 4, having an end 422 corresponding to the one or more indentations 412 of locking nut 410, can be used to tighten and/or loosen locking nut 410. Exemplary "non-traditional" tools 420, corresponding to exemplary "non-traditional" configurations, may include tools 420 that have an end 422 that is not slotted, cross-slotted (a Philips end 422), hexagonal, or another end 422, corresponding to an indentation 412 that is not slotted, cross-slotted, hexagonal, etc. Standard tools 420, corresponding to standard ends 422 (slotted, cross-slotted, hexagonal, etc.), may also be used in various embodiments.

In addition, and as shown in FIG. 4, a second locking mechanism 480 may be implemented as part of system 50/collar 150. Second locking mechanism 480, as shown in FIG. 4, may comprise a hex-key screw or other mechanism suitable to engage threaded rod 460 or another portion of locking mechanism 450, to further secure collar 150 around/about wire grip portion 100 as desired.

FIG. 4 also shows a wire cylinder 490 used in connection with wire grip portion 100 and collar 150, as part of an exemplary system 50 of the present disclosure. Wire cylinder 490 can be positioned adjacent to wire grip portion 100, coupled to wire grip portion 100, or formed as unitary piece along with wire grip portion 100, as desired. Exemplary wire cylinders 490 are sized and shaped so that all wires 400 used in connection with wire grip portion 100 can fit therein. A section of wire cylinder 490, such as a 1'-2' section, can be placed around wires 400, so that wires 400 extend from wire cylinder 490 at both relative ends, with one end being the, or adjacent to, wire grip portion 100. Use of an exemplary wire cylinder 490 of the present disclosure would further thwart wire 400 theft.

Systems 50 of the present disclosure can be used with various types of electrical equipment and related housings. For example, a plurality of wires 400 is generally used to connect to electrical equipment, such as lampposts, which can be connected in series. In one example, three or four separate wires 400 can be used, with each wire 400 being made of copper or another metal that is a potential target for thieves, as said metals can be sold as scrap. The cost to repair and/or replace lampposts that have been tampered with is significantly higher than the cost of just the wire 400, so it would be useful to have some sort of invention, such as disclosed herein, that can prevent or significantly reduce wire 400 theft.

In addition to preventing or reducing incidences of wire theft, system 50 is useful to generally protect wires 400 (such as with a wire cylinder 490 or generally from using wire grip portion 100), and can also keep foreign debris from entering the wire cylinder 490 or another conduit used in connection with wires 400, such debris including, but not limited to, dirt, mice, and rocks, so to further reduce maintenance costs. Systems 50 can also help prevent wires 400 from being damaged or pulled out due to construction mistakes while digging, and can also protect wires 400 in pullboxes, handholes, service points, and foundations. Various wire 400 sizes can be used with systems 50 of the present disclosure, and different sized apertures 102 can be defined within wire grip portion 100, corresponding with wires 400. Wire grip portions 100 can also be chemical resistant and further resistant to extreme hot or cold temperatures.

Figure 6:
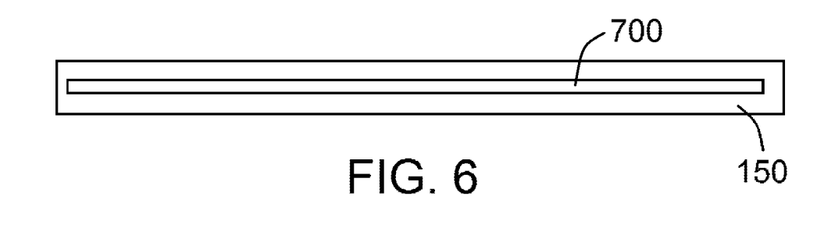
FIGS. 6 and 7 show collars, according to exemplary embodiments of the present disclosure.
Figure 7:
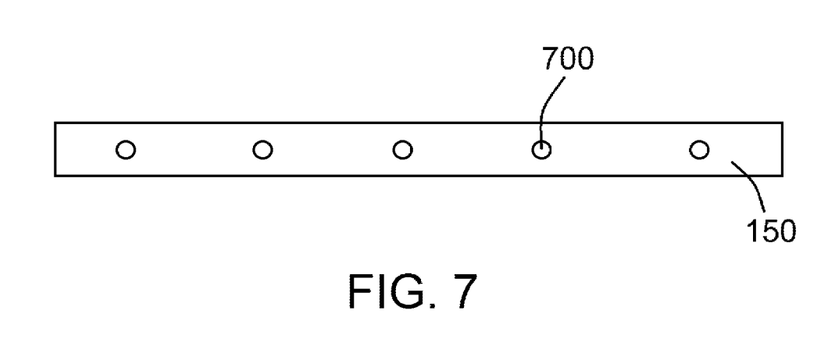

FIGS. 6 and 7 show inside/underside portions of exemplary collars 150 of the present disclosure, with said collars 150 having one or more protrusions 700 thereon. One elongated protrusion 700, such as shown in FIG. 6, or more elongated protrusions 700 can be used, as can one or more round protrusions 700, as shown in FIG. 7, or other shaped protrusions 700. Said protrusions, when in contact with pliable wire grip portion 100, can engage wire grip portion 100 when collar 150 is tightened to further secure wire grip portion 100 within collar 150.

Figure 8:
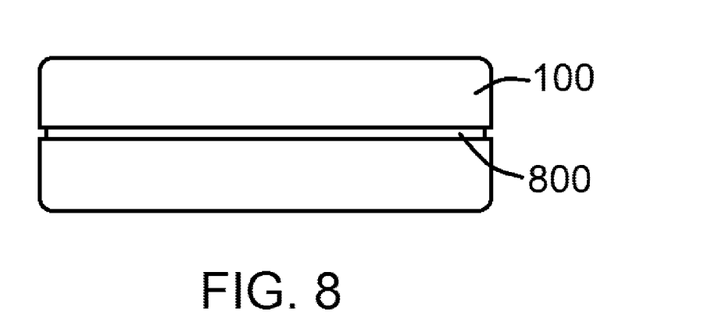
FIGS. 8 and 9 show side views of wire grip portions, according to exemplary embodiments of the present disclosure.
Figure 9:
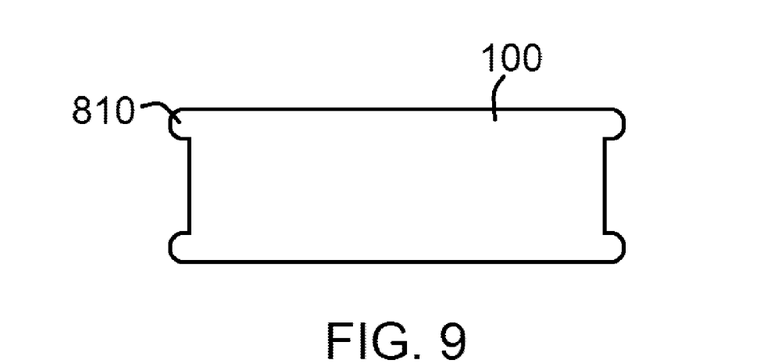

FIGS. 8 and 9 shows side views of exemplary wire grip portions 100 of the present disclosure. As shown in the embodiment shown in FIG. 8, an exemplary wire grip portion 100 can have a notch 800 defined therein, corresponding, for example, to protrusion 700 of collar 150, such as shown in FIG. 6. FIG. 9 shows an exemplary wire grip portion 100 having an extension portion 810, so that when collar 150 is positioned around wire grip portion 100 and tightened, wire grip portion 100 cannot be removed from collar 150.

In an exemplary system 50 of the present disclosure, wire grip portion 100 has a 3" diameter D, a 1" height H, and comprises vulcanized rubber. Four apertures 102, such as $^{21}\!/_{64}$" diameter apertures or other sized and/or number of apertures 102, can be drilled or otherwise defined within wire grip portion 100, with said apertures each being within a 1.25" diameter portion inside wire grip portion 100. Said apertures 102 would then accommodate #4 copper/aluminum wire 400, and access to said apertures 102 could be via two grooves at or about 2.25" deep (so that a $^{3}\!/_{4}$", $^{9}\!/_{16}$", or other length of wire grip portion 100 remains uncut). Collar 150, in at least one embodiment, is a $2^{7}\!/_{8}$" to $3^{3}\!/_{16}$" t-bolt style stainless steel collar 150, having a $^{5}\!/_{16}$" sleeve and $^{10}\!/_{32}$" second locking mechanism (a "set screw"), which can also comprise stainless steel. Torquing locking nut 410 about threaded rod 460 can be performed using a tool 420 having an end 422 corresponding to locking nut 410, said tool 420 being a modified deep-well socket in at least one embodiment, with torquing at 90 inch pounds or a larger or smaller torque amount.

Figure 10A:
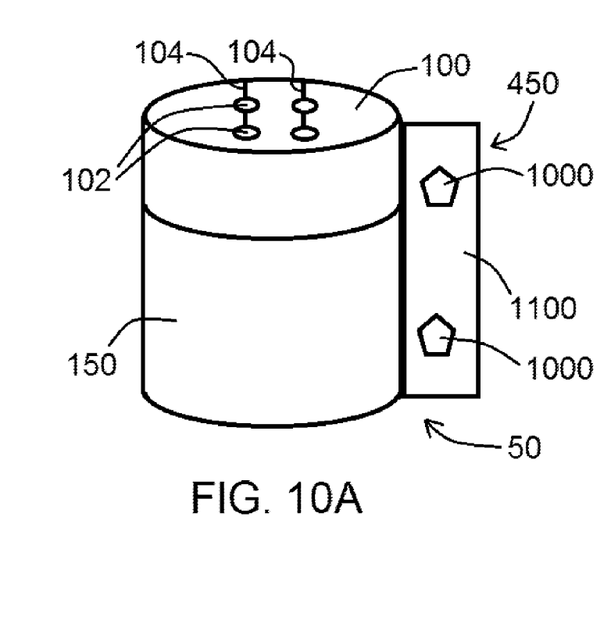
FIGS. 10A, 10B, and 11 show views of a collar, according to exemplary embodiments of the present disclosure.
Figure 10B:
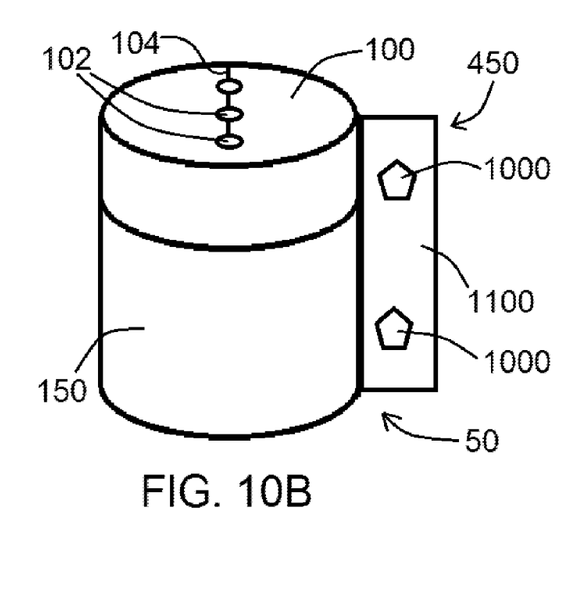

Additional system 50 embodiments of the present disclosure are shown in FIGS. 10A and 10B. As shown in FIGS. 10A and 10B, exemplary systems 50 of the present disclosure comprise a wire grip portion 100 and a collar 150, whereby a locking mechanism 450 coupled to or formed as part of collar 150 is configured to tighten and loosen collar 150 around/about wire grip portion 100 as desired. In at least one embodiment, and as shown in FIGS. 10A and 10B, locking mechanism 450 uses one, two (as shown in FIGS. 10A and 10B), three, or more fasteners 1000 that can be loosened to loosen collar 150 relative to wire grip portion 100 and can be tightened to tighten collar 150 relative to wire grip portion 100. Said fasteners 1000 can comprise bolts (as shown in FIGS. 10A and 10B) or other fasteners known in the art useful to tighten a collar 150 such as referenced herein. The exemplary wire grip portion 100 as shown in FIG. 10A has four apertures 102 and two grooves 104, and the exemplary wire grip portion 100 as shown in FIG. 10B has three apertures and one groove 104.

In the embodiments shown in FIGS. 10A and 10B, and in various other system 50 embodiments of the present disclosure, wire grip portion 100 can comprise vulcanized rubber approximately 1" thick and 3" in diameter and can be cylindrical in shape. The two grooves 104, as shown in FIG. 10A, can be $^{1}\!/_{2}$" apart and $2^{1}\!/_{4}$" deep as measured from an outer perimeter of wire grip portion 100. Grooves 104, in various embodiments, can have $^{1}\!/_{8}$" cuts at their relative ends. Apertures 102, as shown in FIGS. 10A and 10B, can be $^{21}\!/_{64}$" in diameter. In the system 50 embodiment shown in FIG. 10A, the two grooves 104 access four apertures 102 within a $1^{1}\!/_{4}$" circumference, and as shown in FIG. 10B, the single groove 104 accesses three apertures 102 within a $1^{1}\!/_{4}$" circumference of the 3" diameter wire grip portion 100. The various dimensions of wire grip portions 100, apertures 102, grooves 104, etc., can differ from the specific dimensions referenced herein, depending on the desired system 50 embodiment.

Figure 11:
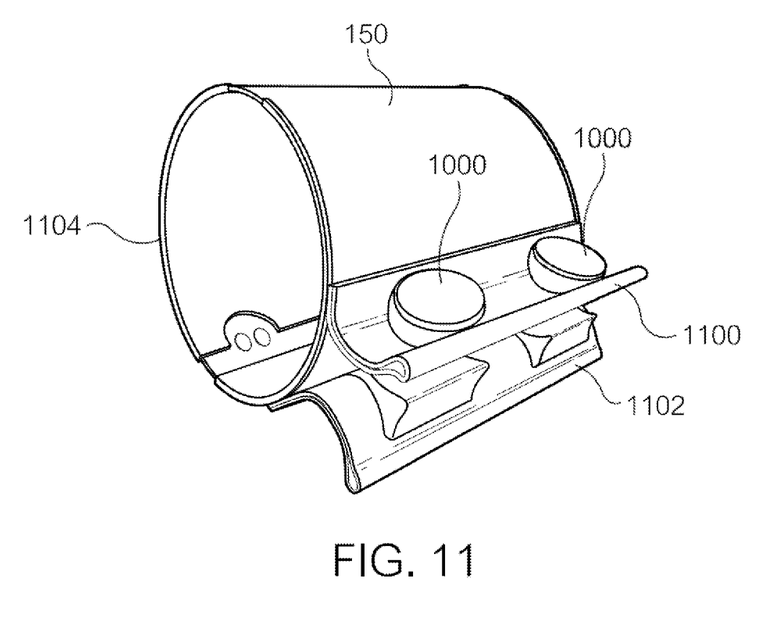

As shown in FIG. 11, for example, collar 150 can comprise a first collar flange 1100 and a second collar flange 1102 extending from a perimeter portion 1104, whereby one or more fasteners 1000 (such as two fasteners 1000 shown in the figure) can be used to pull first collar flange 1100 toward second collar flange 1102 to tighten collar 150 and can also be used to separate first collar flange 1100 from second collar flange 1102 to loosen collar 150, such as by rotating fasteners 1000 in a first or second direction. Collar 150, as shown in FIGS. 10A, 10B, and 11, for example, can be $3^{1}\!/_{2}$" tall (or a different dimension).

Figure 12:
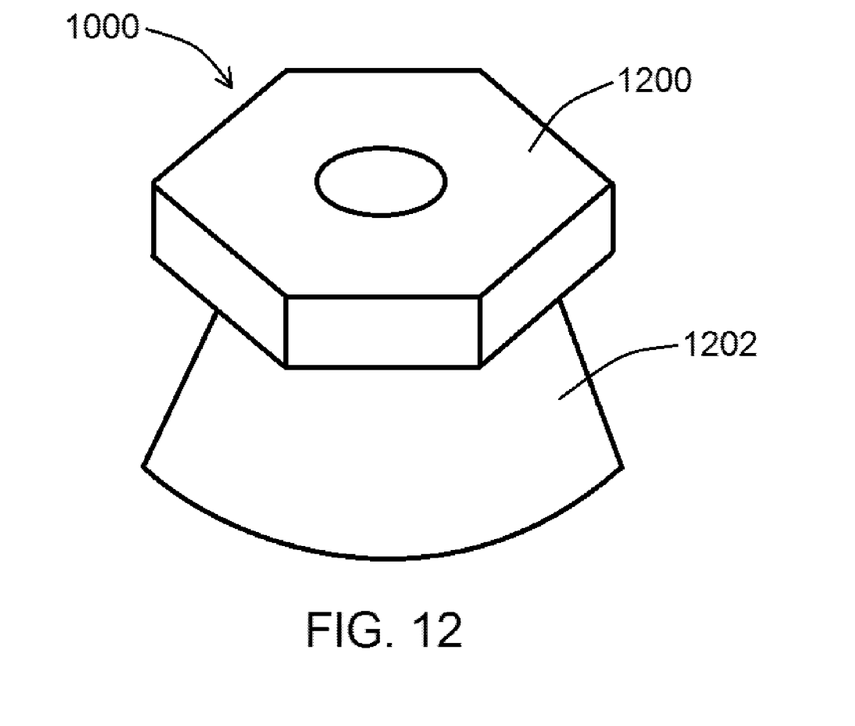
FIG. 12 shows a fastener, according to an exemplary embodiment of the present disclosure.

Fasteners 1000, as shown in FIGS. 10A and 10B, can be pentagonal (thus requiring a special socket or tool 420), or can be breakaway fasteners 1000, for example, that leave nothing but a cone, such as shown in FIG. 12. As shown in FIG. 12, an exemplary fastener 1000 can have a torquing portion (an exemplary first portion 1200) and a cone portion (an exemplary second portion 1202), so that after tightening fastener 1000, first portion 1200 can break off, leaving just the second portion 1202 behind, which is generally more difficult to remove.

As referenced herein, exemplary systems 50 of the present disclosure can be used to prevent wire 400 theft and/or protect the wires 400 from debris entering a pipe containing said wires. Exemplary systems 50 can also work with various sizes of conductors. Portions of systems 50, such as wire grip portions 100 and/or collars 150, are highly resistant to gas, oils, and other corrosive chemicals.

Regarding wire prevention, exemplary systems 50 of the present disclosure:
  a. can prevent wires 400 from being pulled out:
    i. From pole to pole (such as light poles);
    ii. From pole to service point; or
    iii. From service point to high mast tower;
  b. have been tested at 600 foot pounds of torque, using a Dillon dynamometer (to measure tensile strength);
  c. can have a dual locking system, such as with a first locking mechanism 450 and a second locking mechanism 480, to ensure wire 400 protection; and/or
  d. can be used with a custom made socket (such as a tool 420) to apply and remove systems 50 as desired, noting that in various embodiments, bolt cutters, wire cutters, hammers, sawzalls (reciprocating saws), other electrical tools, etc., cannot remove the systems 50 within reason.

Various system 50 embodiments can also prevent foreign debris from entering the pipes at service points, foundations, pull boxes and hand holes. This can also prevent maintenance issues from objects entering the pipes, as rocks and dirt can damage the insulation on the conductor (wire coatings) which in return can result in a fault in the future. In addition, mice can chew through the insulation on the wire 400 and cause cable faults mostly in service points and in roadway foundations, which can be costly repairs. From experience, mice are the second leading cause of wire destruction, as they can destroy service points and cause a lot of extra expense to the state each year.

Regarding construction mistakes, exemplary systems 50 of the present disclosure can help prevent wire 400 from inadvertently being pulled out of pull boxes, hand holes, service points and foundations during construction. Wire 400 being pulled out at construction site is a frequent issue during construction, and if an exemplary system 50 of the present disclosure is used as referenced herein, it will put tension on the wire(s) 400 and in an ideal situation the worker will stop, due to the excessive tension, before the wire(s) 400 is/are completely pulled out of a foundation or service point. This will prevent unnecessary cost to contractor and/or to the state department of transportation.

Figure 13:
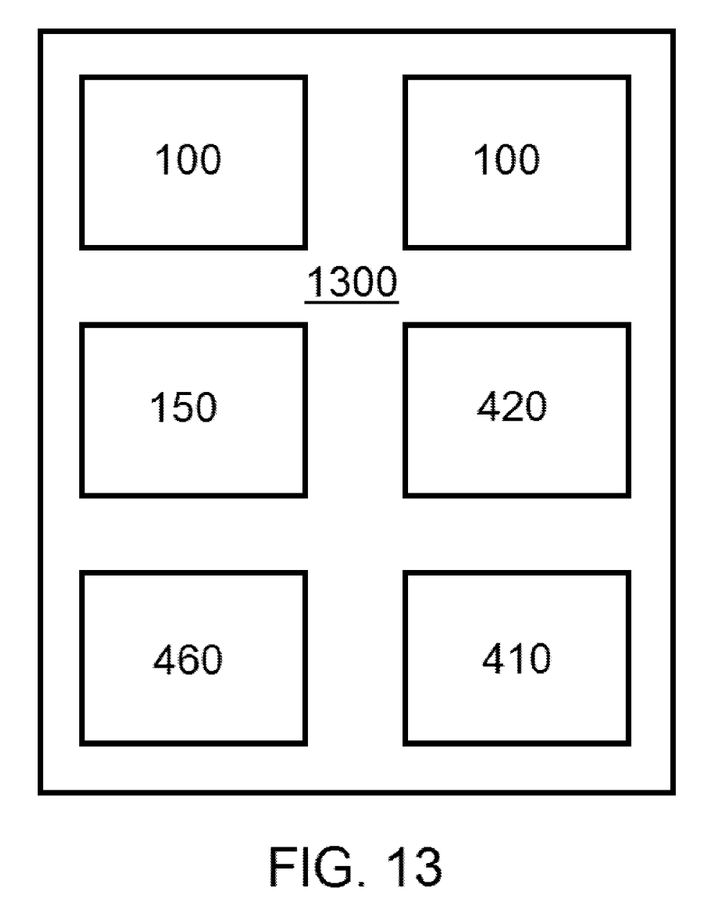
FIG. 13 shows a block diagram of components of a kit, according to an exemplary embodiment of the present disclosure.

In addition to the foregoing, components of various systems 50, such as wire grip portions 100, collars 150, etc., as described herein, can be formed and sold as kits that would include two or more components, as referenced herein. For example, and as shown in FIG. 13, an exemplary kit 1300 of the present disclosure can comprise two wire grip portions 100, a collar 150, a threaded rod 460, a locking nut 410, and a tool 420 to tighten locking nut 410. Other kit 1300 embodiments of the present disclosure can comprise at least two items referenced herein, such as, for example, one or more of a wire grip portion 100, collar 150, locking nut 410, locking mechanism 450, threaded rod 460, tool 420, and/or fasteners 1000.

While various embodiments of devices and systems to secure wires and prevent wire theft and methods of using the same have been described in considerable detail herein, the embodiments are merely offered as non-limiting examples of the disclosure described herein. It will therefore be understood that various changes and modifications may be made, and equivalents may be substituted for elements thereof, without departing from the scope of the present disclosure. The present disclosure is not intended to be exhaustive or limiting with respect to the content thereof.

Further, in describing representative embodiments, the present disclosure may have presented a method and/or a process as a particular sequence of steps. However, to the extent that the method or process does not rely on the particular order of steps set forth therein, the method or process should not be limited to the particular sequence of steps described, as other sequences of steps may be possible. Therefore, the particular order of the steps disclosed herein should not be construed as limitations of the present disclosure. In addition, disclosure directed to a method and/or process should not be limited to the performance of their steps in the order written. Such sequences may be varied and still remain within the scope of the present disclosure.

The invention claimed:

1. A system, comprising:
   a wire grip portion comprising a compressible material and having a first aperture and a first groove defined therein, the first groove extending from an outer boundary of the wire grip portion to the first aperture;
   a collar configured to surround the outer boundary of the wire grip portion; and
   a first locking mechanism coupled to or formed as part of the collar and comprising a first fastener portion and a second fastener portion, the first fastener portion of the first locking mechanism configured so to tighten the collar relative to the wire grip portion and to break off from the second fastener portion which remains as part of the locking mechanism.

2. The system of claim 1, wherein when a first wire is positioned within the first aperture and the first locking mechanism is tightened, the first wire is secured within the wire grip portion.

3. The system of claim 1, wherein the wire grip portion is generally cylindrical as defined by the outer boundary and a height of the wire grip portion.

4. The system of claim 3, wherein the first groove has a depth equal to the height of the wire grip portion.

5. The system of claim 1, wherein the wire grip portion also has a second aperture defined therein, and wherein the first groove extends from the outer boundary of the wire grip portion to the first aperture and to the second aperture.

6. The system of claim 5, wherein the wire grip portion also has a third aperture defined therein, and wherein the first groove extends from the outer boundary of the wire grip portion to the first aperture to the second aperture and to the third aperture.

7. The system of claim 5, wherein the wire grip portion also has a third aperture and a fourth aperture defined therein, and wherein a second groove extends from the outer boundary of the wire grip portion to the third aperture and to the fourth aperture.

8. The system of claim 1, wherein the first locking mechanism comprises a threaded rod and a locking nut, wherein part of the first locking mechanism is present within a flange coupled to the collar.

9. The system of claim 8, wherein rotation of the locking nut in a first direction causes the first locking mechanism to tighten the collar relative to the wire grip portion, and wherein rotation of the locking nut in a second direction causes the first locking mechanism to loosen the collar relative to the wire grip portion.

10. The system of claim 8, further comprising:
    a second locking mechanism configured to engage the threaded rod upon rotation in a first direction.

11. The system of claim 8, wherein the first locking mechanism comprises a first fastener configured to engage a first collar flange and a second collar flange extending from a perimeter portion of the collar.

12. The system of claim 11, wherein rotation of the first fastener in a first direction causes the first locking mechanism to tighten the collar relative to the wire grip portion, and wherein rotation of the first fastener in a second direction causes the first locking mechanism to loosen the collar relative to the wire grip portion.

13. The system of claim 1, further comprising:
    a wire cylinder coupled to or positioned adjacent to wire grip portion, the wire cylinder configured to receive one or more wires therethrough.

14. A system, comprising:
    a wire grip portion comprising a compressible material and having a first aperture, a second aperture, and a first groove defined therein, the first groove extending from an outer boundary of the wire grip portion to the first aperture and to the second aperture;
    a collar configured to surround the outer boundary of the wire grip portion; and
    a first locking mechanism coupled to or formed as part of the collar and comprising a first fastener portion and a second fastener portion, the first fastener portion of the first locking mechanism configured so to tighten the collar relative to the wire grip portion and to break off from the second fastener portion which remains as part of the locking mechanism;
    wherein when a first wire is positioned within the first aperture and the first locking mechanism is tightened, the first wire is secured within the wire grip portion.

15. The system of claim 14, wherein the wire grip portion also has a third aperture defined therein, and wherein the first groove extends from the outer boundary of the wire grip portion to the first aperture to the second aperture and to the third aperture.

16. The system of claim 14, wherein the wire grip portion also has a third aperture and a fourth aperture defined therein, and wherein a second groove extends from the outer boundary of the wire grip portion to the third aperture and to the fourth aperture.

17. The system of claim 14, wherein the first locking mechanism comprises a threaded rod and a locking nut, wherein part of the first locking mechanism is present within a flange coupled to the collar, wherein rotation of the locking nut in a first direction causes the first locking mechanism to tighten the collar relative to the wire grip portion, and wherein rotation of the locking nut in a second direction causes the first locking mechanism to loosen the collar relative to the wire grip portion.

18. The system of claim 14, wherein the first locking mechanism comprises a first fastener configured to engage a first collar flange and a second collar flange extending from a perimeter portion of the collar, wherein rotation of the first fastener in a first direction causes the first locking mechanism to tighten the collar relative to the wire grip portion, and wherein rotation of the first fastener in a second direction causes the first locking mechanism to loosen the collar relative to the wire grip portion.

19. A method, comprising:
 positioning a first wire into a first aperture of a system, the system comprising:
  a wire grip portion comprising a compressible material and having the first aperture and a first groove defined therein, the first groove extending from an outer boundary of the wire grip portion to the first aperture;
  a collar configured to surround the outer boundary of the wire grip portion; and
  a first locking mechanism coupled to or formed as part of the collar, the first locking mechanism configured so to tighten the collar relative to the wire grip portion; and
 tightening the first locking mechanism to secure the first wire within the wire grip portion by tightening a first portion of a fastener of the first locking mechanism so to break the first portion of the fastener off from a second portion of the fastener which remains as part of the first locking mechanism.

\* \* \* \* \*